United States Patent
Chen (10) Patent No.: US 9,642,281 B1
(45) Date of Patent: May 2, 2017

(54) BUCKLE SET FOR SLIDING RAIL OF INDUSTRIAL RACKMOUNT CHASSIS

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipei (TW)

( * ) Notice: Subject to any disclaimer, the term of this patent is extended or adjusted under 35 U.S.C. 154(b) by 0 days.

(21) Appl. No.: 14/979,931

(22) Filed: Dec. 28, 2015

(51) Int. Cl.
*H05K 7/00* (2006.01)
*H05K 7/14* (2006.01)

(52) U.S. Cl.
CPC .................... *H05K 7/1489* (2013.01)

(58) Field of Classification Search
CPC ........ A47F 5/0093; A47F 5/0846; A47F 1/12; A47F 1/126; A47F 7/285; A47F 5/005; A47F 5/10; A47F 1/125; A47F 5/0025; A47F 3/06; A47F 5/00; A47F 7/0042; A47F 7/14; A47F 7/28; A47F 7/30; A47F 1/04; A47B 53/02; A47B 53/00; A47B 88/044; A47B 88/0485; A47B 46/00; A47B 96/067; A47B 96/025; A47B 45/00; A47B 61/003; A47B 81/00; A47B 2210/0024; A47B 61/02; A47B 2088/0448; A47B 2210/0043; B65G 1/026; B65G 1/06; B65G 1/10; B65G 1/02; B65G 1/023; B65G 1/08; B65G 2201/0294; B65G 9/002; B65G 2201/0229; B65G 1/0442; B65G 1/133; B65G 49/062; B65G 1/0457; B65G 2201/02

USPC ............. 248/220.1, 220.22, 220.41, 220.43; 211/126.15, 162; 312/333
See application file for complete search history.

(56) References Cited

U.S. PATENT DOCUMENTS

| | | | | |
|---|---|---|---|---|
| 7,699,279 | B2 * | 4/2010 | Chen | A47B 88/044 248/220.22 |
| 8,328,300 | B2 * | 12/2012 | Yu | A47B 88/044 312/333 |
| 9,125,489 | B2 * | 9/2015 | Chen | A47B 88/044 |
| 2009/0294393 | A1 * | 12/2009 | Chen | H05K 7/1489 211/175 |
| 2014/0132139 | A1 * | 5/2014 | Chang | H05K 7/1489 312/333 |

* cited by examiner

*Primary Examiner* — Steven Marsh
(74) *Attorney, Agent, or Firm* — Rosenberg, Klein & Lee (57) ABSTRACT

A buckle set for a sliding rail of an industrial rackmount chassis includes a base, a pressing member, a hook slider and a hook rod. The buckle set is provided for installing the sliding rail into the industrial rackmount chassis. The installed hook rod is fixed automatically to prevent it from falling off. A slope pushing design between the pressing member and the hook slider drives the hook rod to shift and retract in order to remove the sliding rail quickly. A safety buckle design is added to the pressing member, such that after the hook rod is fixed to the industrial rackmount chassis, the pressing member is locked automatically to prevent the sliding rail from falling off due to human wrong operations. When it is necessary to remove the sliding rail, the safety buckle and the pressing member are pressed simultaneously to release the locked status quickly.

10 Claims, 6 Drawing Sheets

BUCKLE SET FOR SLIDING RAIL OF INDUSTRIAL RACKMOUNT CHASSIS

TECHNICAL FIELD

The technical field relates to an industrial computer rackmount chassis, and more particularly to a buckle set for a sliding rail of an industrial rackmount chassis that can be installed or removed quickly and conveniently, and the buckle set can be locked automatically to prevent it from falling off after installation

BACKGROUND

In general, industrial computers are installed horizontally in an industrial rackmount chassis, and a rack is vertically erected from each of the four corners of the industrial rackmount chassis, and a plurality of fixing holes or screw holes vertically arranged apart from each other and disposed on a side opposite to each of the racks and fixed by a fixing block or a fixing screw, so that the industrial computers are vertically stacked in the industrial rackmount chassis.

Since it is necessary to remove the industrial computers for maintenance and repair, the use of the fixing block or fixing screw takes much time and effort for the installation and removal and thus is very convenient, therefore a pull-out sliding rail is introduced to substitute the conventional installation by using the fixing block or fixing screw. In addition, the pull-out sliding rail has the pulling stretch and stacking contraction features, so that the sliding rails of different lengths can overcome the problem of having insufficient space by means of a two-stage or three-stage design, and the industrial computer may be pushed into the industrial computer rackmount chassis, or selectively pulled out from the industrial computer rackmount chassis for expansion, replacement, inspection, or maintenance and repair. Obviously, the pull-out sliding rail improves the convenience of repair and maintenance significantly.

Conventionally, a fixing screw is used to fix the sliding rail into the industrial rackmount chassis, but the installation and removal of the fixing screw is still quite troublesome.

In recent years, the design of installing a sliding rail by a spanning method is disclosed, wherein a fastener module is installed separately at a portion of both ends of the sliding rail and provided for passing into the fixing holes of the racks, and the weight of the industrial computer is used to fix and maintain the sliding rail between the racks, so as to improve the convenience of installation or removal. However, the method of simply using the weight of the industrial computer for pressing to achieve the fixation is not secured. If there is a severe vibration or the rackmount chassis topples, the sliding rail may fall off to cause damages to the industrial computers. Therefore, some manufacturers add screws for the fixation to improve the stability of the installed sliding rail, but such method further causes inconvenience to installation and removal.

In view of the aforementioned drawbacks of the prior art, related manufacturers designed and developed a buckle set with an automatic locking function in recent years, and a special hook design is used to automatically lock the position of the buckle set without requiring any screw after the sliding rail is installed. However, such hook design may result in a loosened buckle set through wrong operations, and thus requirement further improvements.

SUMMARY

In view of the problems of the prior art, it is a primary objective of this disclosure to provide a buckle set for a sliding rail of an industrial rackmount chassis, and the buckle set is provided for fixing a sliding rail into a computer rackmount chassis quickly, and using its locking function to prevent the installed sliding rail from being loosened due to wrong operations, so as to improve the efficiency and stability of the installation significantly, while providing the effects of locking the sliding rail automatically to prevent it from falling off and removing an industrial computer from the sliding rail quickly.

To achieve the aforementioned and other objectives, this disclosure provides a buckle set for a sliding rail of an industrial rackmount chassis, wherein the industrial rackmount chassis comprises a rack installed to each of four corners of the industrial rackmount chassis and a plurality of engaging holes formed on each of the vertically erected racks and arranged apart from one another, and the buckle set is installed at an end of the sliding rail facing an outer side of the industrial rackmount chassis and provided for installing the sliding rail horizontally between the racks, and the buckle set comprises: a base, fixed to an end of the sliding rail, and having at least one positioning block disposed on a side of the base relative to the engaging holes and provided for positioning and fixing the base onto the rack by passing the positioning block into the respective engaging hole, and a chute formed inside the base and disposed in an axial direction of the positioning block; a pressing member, movably installed in the chute, and a portion of the pressing member being passed through and exposed from a surface of the base, and the pressing member having a first slope portion disposed on a side in the base; a hook slider, movably installed in the chute, and having a second slope portion disposed on a side corresponsive to the pressing member, so that after the first slope portion and the second slope portion abut against each other, the pressing member may be operated to slide the hook slider in a direction perpendicular to the axial direction of the positioning block; and a hook rod, with an end coupled to the hook slider, and the other end having at least one inverted hook portion, and an end of the hook rod having the inverted hook portion being extended to the outside of a side of the base having the positioning block, such that after the positioning block is positioned at the rack, the hook rod is precisely fixed to a surface of the rack, and when the pressing member is pressed, the hook rod retracts away and disengages from the position of the engaging hole to define a released status.

Wherein, the pressing member has a guide slot formed on a side of pressing member having the first slope portion, and the hook slider has a guide block disposed on a side of the hook slider having the second slope portion and configured to be corresponsive to the guide slot, so that the guide block is disposed in the guide slot. Therefore, the hook slider can be moved more stably without shaking.

In a preferred embodiment, the buckle set for a sliding rail of an industrial rackmount chassis of this disclosure further comprises a pair of first elastic elements, and ends of the pair of first elastic elements being arranged adjacently apart from each other and inside the hook slider, and the other ends of the pair of first elastic elements abutting against an inner surface of the base. Therefore, the hook slider can be operated normally. In addition, the hook slider includes a bump formed on the other side of the hook slider having the first elastic element, and the base has a notch configured to be corresponsive to the bump, so that the bump is disposed in the notch to improve the stability of the use.

In another preferred embodiment, the buckle set for a sliding rail of an industrial rackmount chassis of this disclosure further comprises a safety buckle installed on a side of the pressing member exposed from the base, and provided for latching the base surface to define a locked status, and pressing the safety buckle into the pressing member to define a moving status. In addition, at least one third elastic element is installed between the safety buckle and the base, so that the safety buckle is normally maintained to be exposed from the pressing member. The safety buckle further has another implementation mode, and the safety buckle is operated according to the following method. The safety buckle is pulled out, so that the pressing member is in a moving status, and the buckle set further comprises at least one third elastic element installed between the safety buckle and the base, so that the safety buckle is normally maintained to be exposed from the pressing member. It is noteworthy that the safety buckle and the pressing member are pressed in directions perpendicular to each other to provide an inner pin type or outer pin type safety buckle, so that the safety buckle may be retracted or pulled out to define a released moving status, and prevent the situation of falling off due to wrong operations. Obviously, such operation is convenient.

Further, the base has a limiting groove configured to be corresponsive to the hook rod, and the hook rod is substantially an L-shaped sheet structure provided for movably passing and installing the hook rod into the limiting groove, and a rear end of the hook rod is fixed to the hook slider.

In addition, the positioning block has a positioning column protruded from the center of the positioning block, and the positioning block is substantially in a rectangular shape, and the positioning column is substantially a cylindrical structure, and the hook rod has two inverted hook portions configured to be corresponsive to the positioning block and the positioning column respectively and arranged apart from each other, and each of the inverted hook portions is configured to be corresponsive to the engaging hole to form a triangular shape. The two-stage positioning design is provided for passing the positioning block through the engaging hole of various different shapes formed on the rack, so as to improve the convenience of the installation.

DESCRIPTION OF THE PREFERRED EMBODIMENTS

The above and other objects, features and advantages of this disclosure will become apparent from the following detailed description taken with the accompanying drawings.

With reference to FIGS. 1 to 4 for an exploded view, a perspective view, and a cross-sectional view of a buckle set 1 for a sliding rail 3 of an industrial rackmount chassis 2 in accordance with a preferred embodiment of this disclosure and a schematic view showing an installed status of a preferred embodiment of this disclosure respectively, the industrial rackmount chassis 2 comprises a rack 21 installed at each of four corners of the industrial rackmount chassis 2, and a plurality of engaging holes 211 formed on each of the vertically erected racks 21 and arranged apart from one another, and the buckle set 1 is installed at an end of the sliding rail 3 facing an outer side of the industrial rackmount chassis 2 and provided for installing the sliding rail 3 horizontally between the racks 21, and the buckle set 1 comprises a base 11, a pressing member 12, a hook slider 13, a safety buckle 14 and a hook rod 15.

The base 11 is designed with a shape corresponsive to an end of the sliding rail 3, and a fixing screw (not labeled in the figure) is vertically fixed to an end of the sliding rail 3, and the base 11 has a pair of positioning blocks 111 disposed on a side of the base 11 and opposite to the engaging holes 211, so that the pair of positioning blocks 111 are arranged vertically apart from each other and provided for passing into the two engaging holes respectively to position and fix the base 11 onto the rack 21, and the base has a chute 112 formed therein and disposed in an axial direction of the positioning block. In addition, each of the positioning blocks 111 has a positioning column 113 protruded from the center of the positioning block 111, and the positioning block 111 is substantially in a rectangular shape, and the positioning column 113 is substantially a cylindrical structure, so as to form a two-section (or two-stage) structure having a shape corresponsive to the circular or rectangular shaped engaging hole 211. The base 11 has a limiting groove 114 formed at the center of the base 11 and configured to be corresponsive to the chute 112, so that the chute 112 and the limiting groove 114 are communicated with each other.

the pressing member 12 is movably installed in the chute 112, and a portion of the pressing member 12 is passed and exposed from a surface of the base 11, and the pressing member 12 has a first slope portion 121 disposed on a side in the base 11. In addition, the pressing member 12 has a guide slot 122 formed on a side of the pressing member 12 having the first slope portion 121, and the pressing member 12 has a through hole 123 formed on a surface exposed from a side of the base 11, so that the through hole 123 and the guide slot 122 are communicated with each other. In addition, the through hole 123 is configured to be corresponsive to the lowest point of the pressing member 12 exposed from a surface of the base 11.

The hook slider 13 is movably installed in the chute 122, and the hook slider 13 has a second slope portion 131 disposed on a side of the hook slider 13 and configured to be corresponsive to the pressing member 12, so that the first slope portion 121 and the second slope portion 131 abut each other, and the hook slider 13 has a guide block 132 disposed on a side of the hook slider 13 having the second slope portion 131 and configured to be corresponsive to the guide slot 122, so that the guide block 132 is disposed in the guide slot 122, and the hook slider 13 slides in a direction perpendicular to the axial direction of the positioning column 113 during the operation of the pressing member 12. In addition, the hook slider 13 has a pair of first elastic elements 133 installed therein, and ends of the pair of first elastic elements 133 are arranged adjacently apart from one another and disposed in the hook slider 13, and the other ends of the pair of first elastic elements 133 abut an inner surface of the base 11. In addition, the hook slider 13 has a bump 134 formed on the other side of the hook slider 13 having the first elastic element 133, and the base 11 has a notch 115 configured to be corresponsive to the bump 134, so that the bump 134 is disposed in the notch 115.

The safety buckle 14 is movably installed in the through hole 123 and exposed from a side of the base 11 and further protruded out from a surface of the base 11 to define a locked status, or the safety buckle 14 is pressed into the pressing member 12 to define a moving status. Further, a pair of second elastic elements 141 is installed between the safety buckle 14 and the pressing member 12, so that the safety buckle 14 is normally maintained to be exposed from the pressing member 12.

The hook rod 15 is substantially an L-shaped sheet structure, and provided for movably passing and installing the hook rod 15 into the limiting groove 114, and a rear end of the hook rod 15 if further fixed to the hook slider 13, and the hook rod 15 has two inverted hook portions 151 arranged apart from each other and configured to be corresponsive to the positioning block 111 and the positioning column 113 respectively, and each of the inverted hook portions 151 is configured to be corresponsive to the engaging hole 211 to form a triangular shape, so that an end of the hook rod having the inverted hook portions 151 is extended outside a side of the base 11 having the positioning block 111 after the installation.

Figure 1:
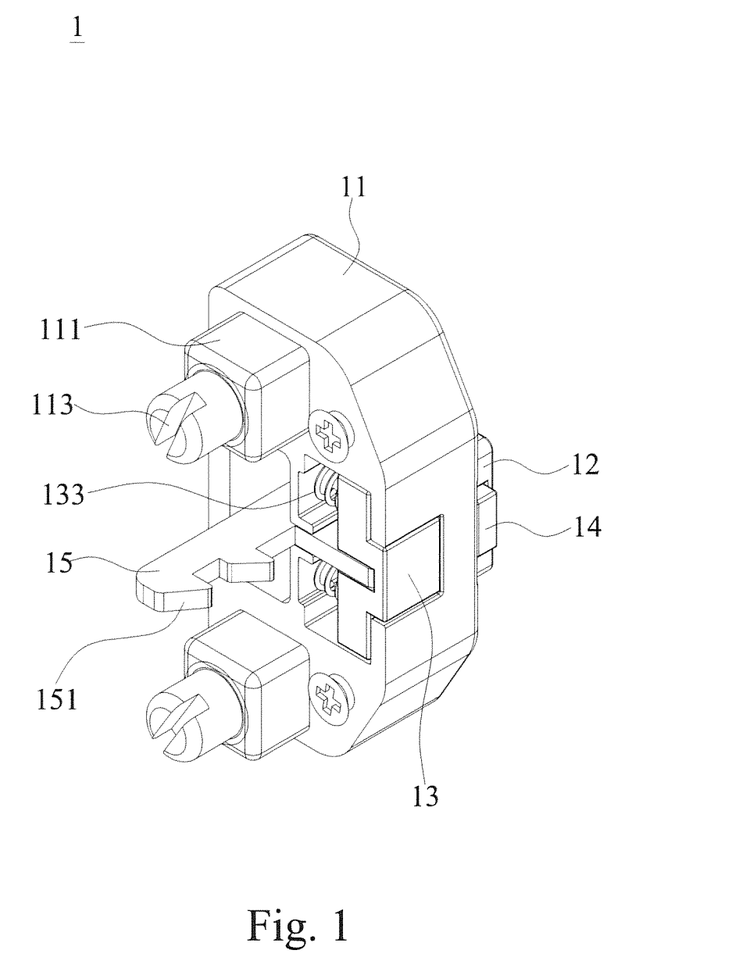
FIG. 1 is an exploded view of a preferred embodiment of this disclosure.
Figure 2:
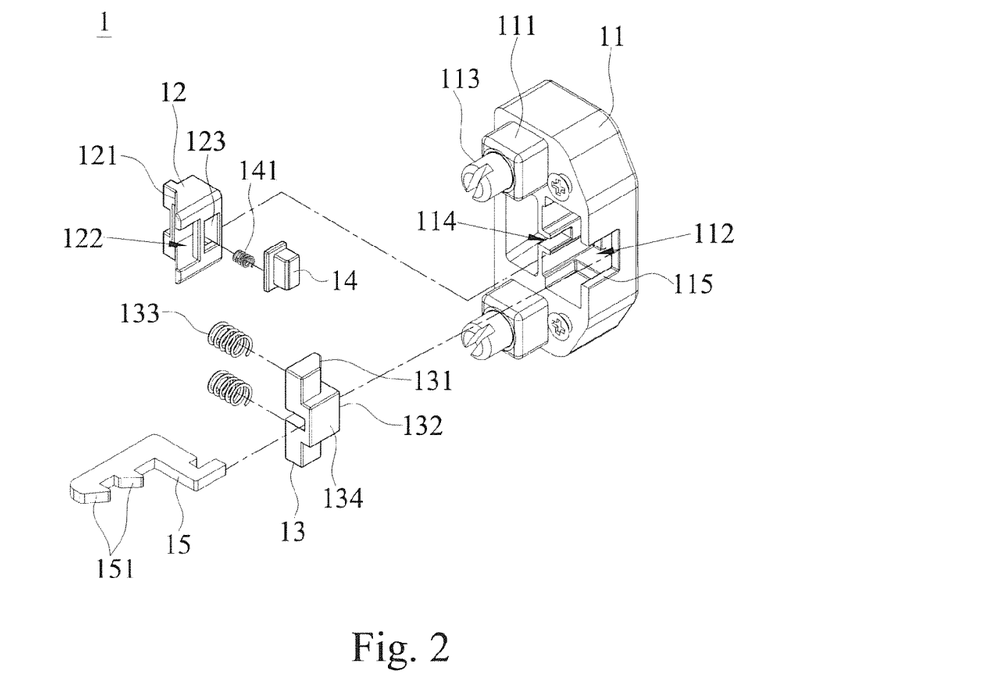
FIG. 2 is a perspective view of a preferred embodiment of this disclosure.
Figure 3:
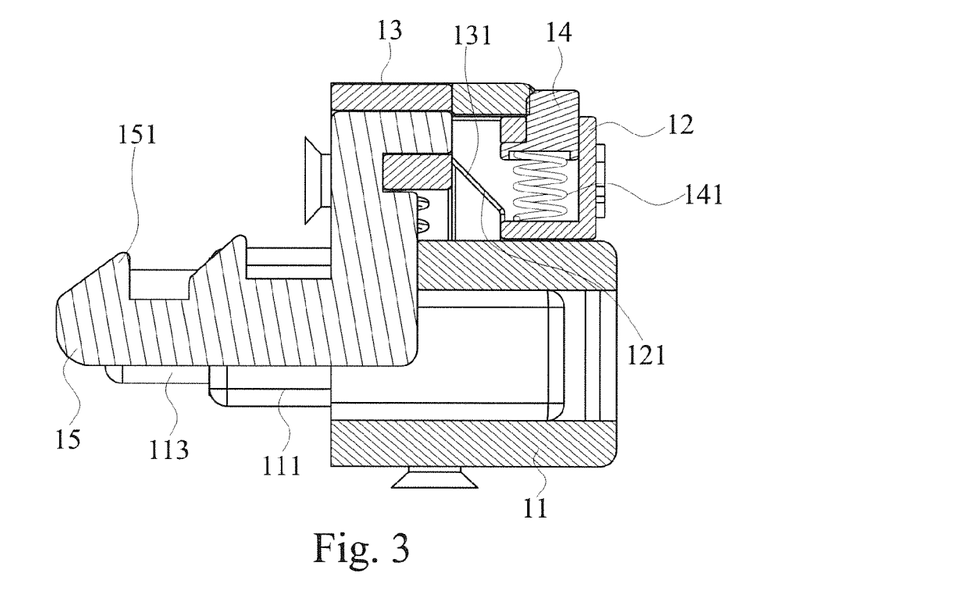
FIG. 3 is a sectional view of a preferred embodiment of this disclosure.
Figure 4:
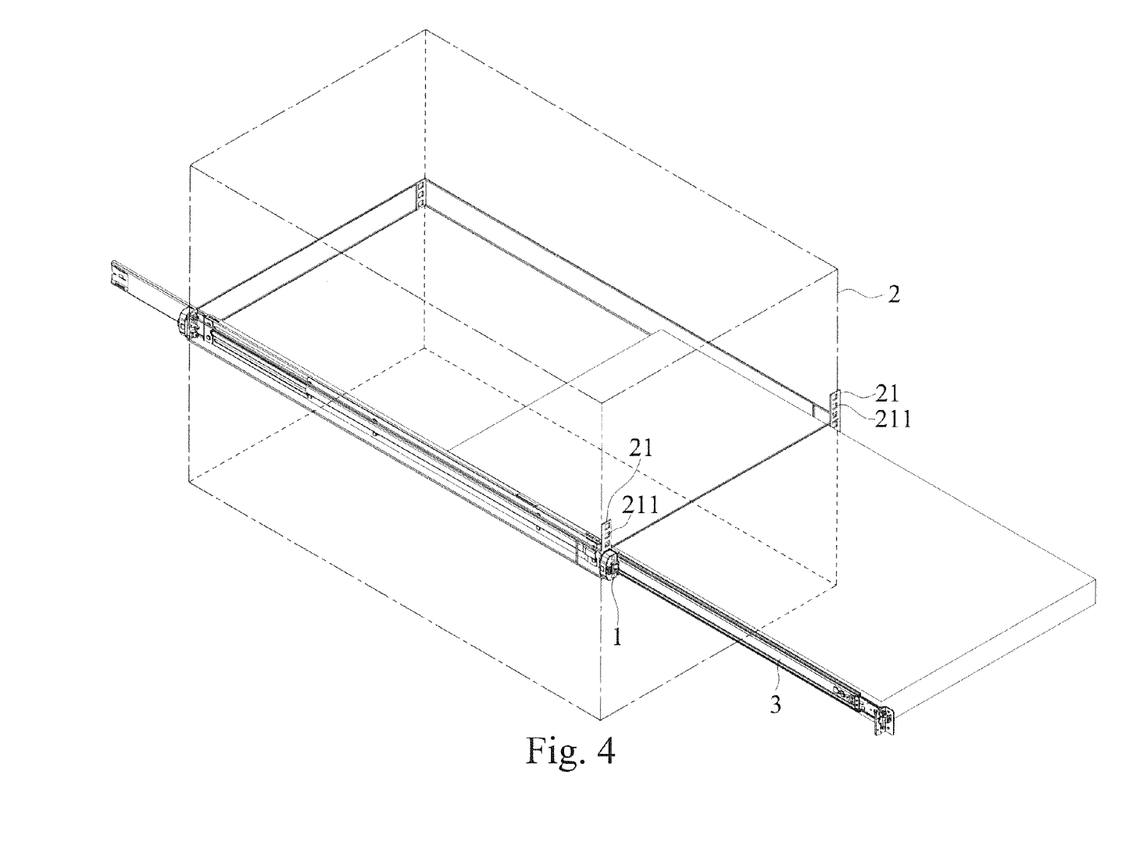
FIG. 4 is a schematic view showing the installed status of a preferred embodiment of this disclosure.
Figure 5:
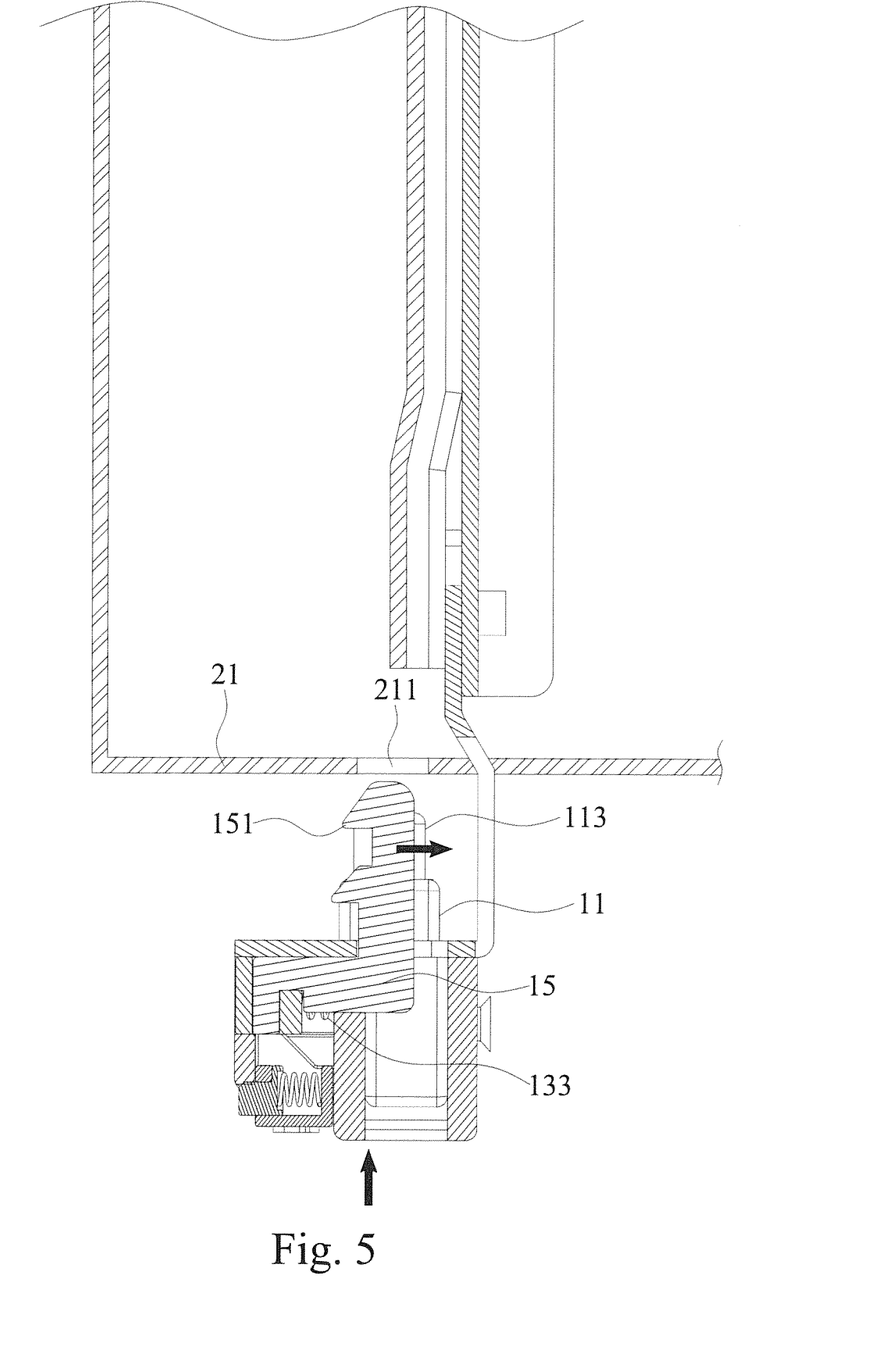
FIG. 5 is a first schematic view showing a using status of a preferred embodiment of this disclosure.
Figure 6:
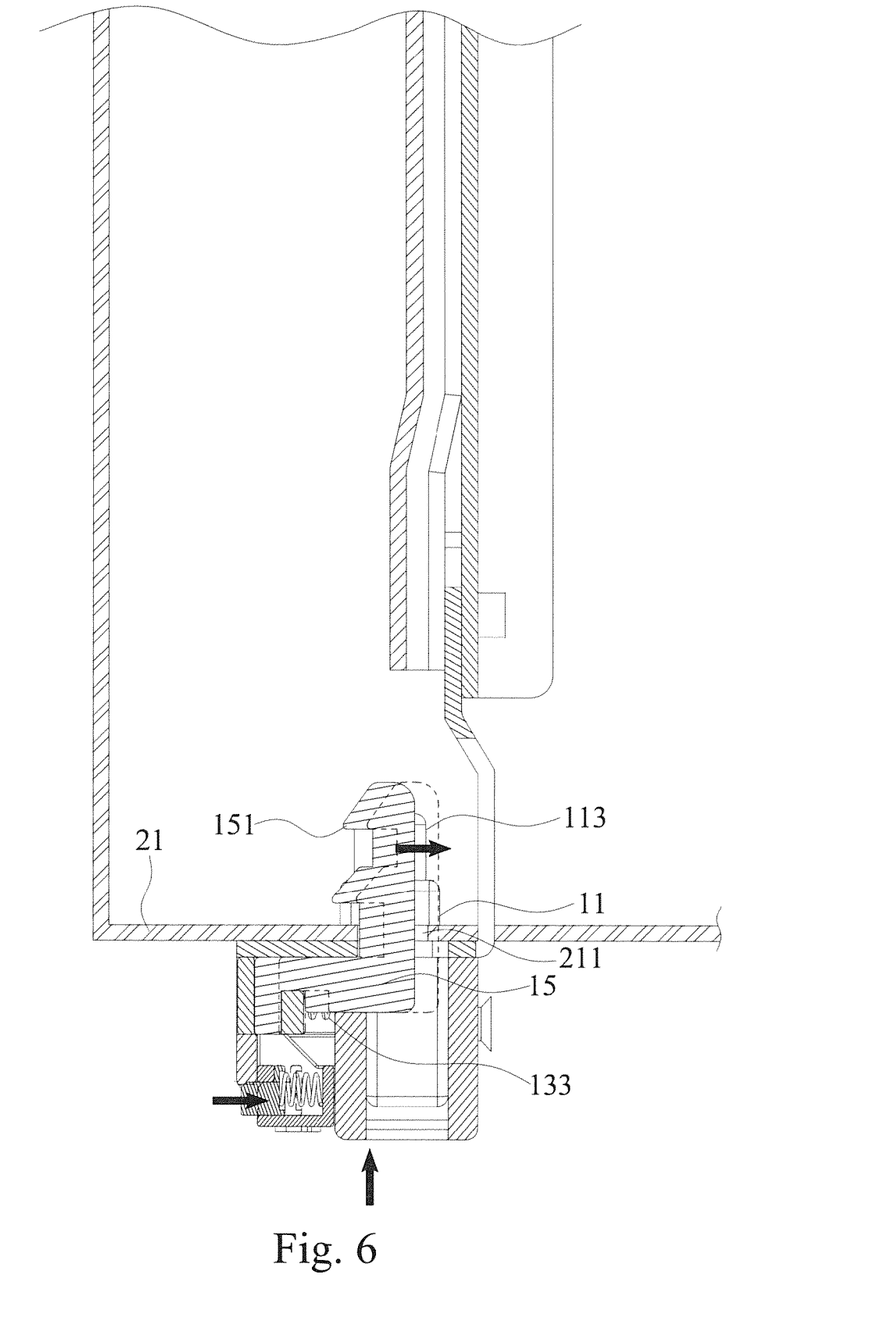
FIG. 6 is a second schematic view showing a using status of a preferred embodiment of this disclosure.

With reference to FIGS. 5 and 6 for the schematic views showing the using statuses in accordance with a preferred embodiment of this disclosure respectively, the buckle set 1 of this disclosure is installed to the sliding rail 3, such that when it is necessary to install the sliding rail 3 to the rack 21, an end of the sliding rail 3 facing the interior is fixed to the rack 21 therein first, and then the two positioning blocks of the base 11 are positioned and passed into the two engaging holes 211 corresponsive to the rack 21 respectively. Since the inverted hook portion 151 of the hook rod 15 is corresponsive to the height of the positioning block 111 or the positioning column 113, therefore if the shape of the engaging hole 211 is corresponsive to the shape of the positioning block 111, then the inverted hook portion 151 corresponsive to the height of the positioning block 111 will be latched into an engaging hole 211 formed at the center of the two engaging holes 211. If the shape of the engaging hole 211 is corresponsive to the shape of the positioning column 113, then the inverted hook portion 151 corresponsive to the height of the positioning column 113 will be latched into an engaging hole 211 formed at the center of the two engaging holes 211. During use, the hook rod 15 is guided by the slope portion of the inverted hook portion 151 to pass into the engaging hole 211, and the straight edge portion is latched and fixed to a surface of the rack 21. During the operation, although the hook slider 13 may be pushed slightly, the hook slider 13 restores its original position by the restoring resilience of the first elastic element 133 after the hook slider 13 completes the latching process. When it is necessary to remove the sliding rail 3 from the rack 21, an operator has to press the safety buckle 14 to operate the pressing member 12 successfully, since the moving directions of the pressing member 12 and the safety buckle 14 are perpendicular to each other. After the pressing member 12 is pressed to drive the hook slider 13 and the hook rod 15, the inverted hook portion 151 of the hook rod 15 is retracted and disengaged from the position of the engaging hole 211 to define a released status, so that the sliding rail 3 can be removed from the rack 21.

Figure 7:
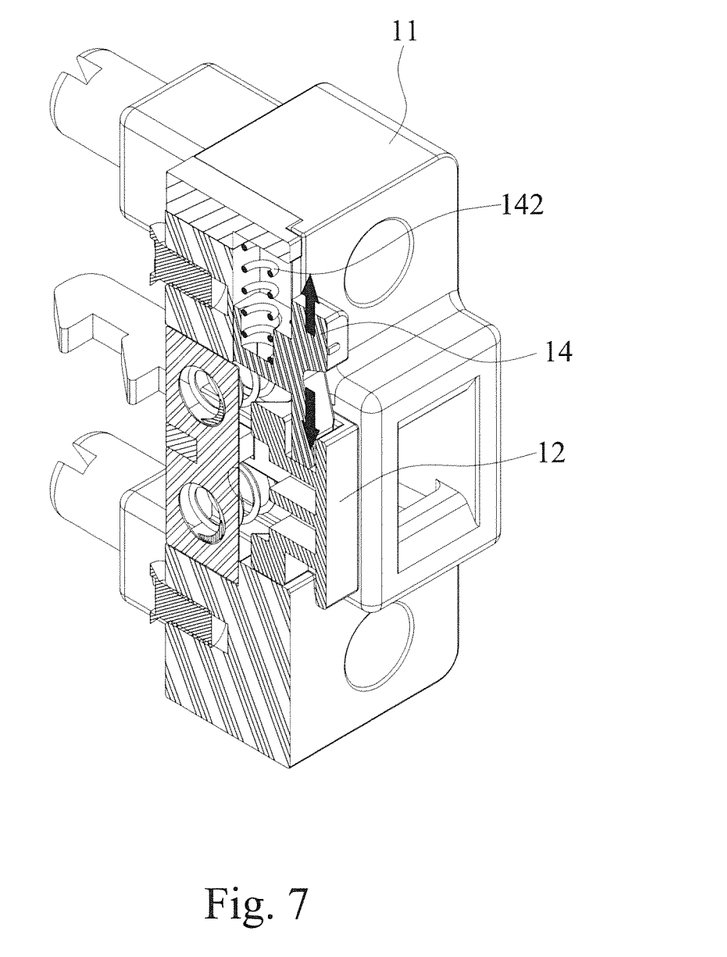
FIG. 7 is a schematic view of another implementation mode of a safety buckle in accordance with a preferred embodiment of this disclosure.

With reference to FIG. 7 for another implementation mode of a safety buckle in accordance with a preferred embodiment of this disclosure, the pressing directions of the safety buckle 14 and the pressing member 12 are also perpendicular to each other, except that this preferred embodiment adopts the outer pin type safety buckle instead of the inner pin type safety buckle, and such safety buckle is also provided for an operator to operate from the exterior of the safety buckle 14. The safety buckle 14 is pulled out, so that the pressing member 12 is situated in a released moving status. For locking, the safety buckle 14 is pushed towards a corresponsive jack of the pressing member 12, so that the pressing member 12 is blocked by the volume of the safety buckle 14 to form a locking status, and such design also prevents the situation of falling off due to wrong operations and provides a convenient operation. In addition, a third elastic element 142 is installed between the safety buckle and the base, so that the safety buckle 14 is normally maintained to be latched to the pressing member 12 by the restoring resilience of the third elastic element 142, so as to define a locked status.

What is claimed is:

1. A buckle set for a sliding rail of an industrial rackmount chassis, wherein the industrial rackmount chassis comprises a plurality of racks installed to each of four corners of the industrial rackmount chassis and a plurality of engaging holes formed on each of the plurality of racks that are vertically erected and arranged apart from one another, and the buckle set is installed at an end of the sliding rail facing an outer side of the industrial rackmount chassis and provided for installing the sliding rail horizontally between the plurality of racks, and the buckle set comprises:

a base, fixed to an end of the sliding rail, and having at least one positioning block disposed on a side of the base corresponding the plurality of engaging holes and provided for positioning and fixing the base onto the plurality of racks by passing the positioning block into the plurality of engaging holes, and a chute formed inside the base and disposed in an axial direction of the positioning block;

a pressing member, movably installed in the chute, and a portion of the pressing member being passed through and exposed from a surface of the base, and the pressing member having a first slope portion disposed on a side in the base;

a hook slider, movably installed in the chute, and having a second slope portion disposed on a side corresponsive to the pressing member, so that after the first slope portion and the second slope portion abut against each other, the pressing member may be operated to slide the hook slider in a direction perpendicular to the axial direction of the positioning block; and a hook rod, with an end coupled to the hook slider, and an end having at least one inverted hook portion, and the end of the hook rod having the inverted hook portion being extended outwardly from a side of the base having the positioning block, such that after the positioning block is positioned at the plurality of racks, the hook rod is precisely fixed to a surface of the plurality of racks, and when the pressing member is pressed, the hook rod retracts away and disengages from the position of the plurality of engaging holes to define a released status.

2. The buckle set for a sliding rail of an industrial rackmount chassis according to claim 1, wherein the pressing member has a guide slot formed on a side of pressing member having the first slope portion, and the hook slider has a guide block disposed on a side of the hook slider having the second slope portion and configured to be corresponsive to the guide slot, so that the guide block is disposed in the guide slot.

3. The buckle set for a sliding rail of an industrial rackmount chassis according to claim 1, further comprising a pair of first elastic elements, and ends of the pair of first elastic elements being arranged adjacently apart from each other and inside the hook slider, and other ends of the pair of first elastic elements abutting against an inner surface of the base.

4. The buckle set for a sliding rail of an industrial rackmount chassis according to claim 3, wherein the hook slider includes a bump formed on a side of the hook slider having the first elastic element, and the base has a notch configured to be corresponsive to the bump, so that the bump is disposed in the notch.

5. The buckle set for a sliding rail of an industrial rackmount chassis according to claim 1, further comprising a safety buckle installed on a side of the pressing member exposed from the base, and provided for latching the base surface to define a locked status, and pressing the safety buckle into the pressing member to define a moving status.

6. The buckle set for a sliding rail of an industrial rackmount chassis according to claim 5, further comprising at least one second elastic element installed between the safety buckle and the pressing member, so that the safety buckle is normally maintained to be exposed from the pressing member.

7. The buckle set for a sliding rail of an industrial rackmount chassis according to claim 1, further comprising a safety buckle installed onto a side of the pressing member exposed from the base, and provided for latching the base surface to define a locked status, and pulling the safety buckle out from the pressing member to define a moving status.

8. The buckle set for a sliding rail of an industrial rackmount chassis according to claim 7, further comprising at least one third elastic element installed between the safety buckle and the base, so that the safety buckle is normally maintained to be exposed from the pressing member.

9. The buckle set for a sliding rail of an industrial rackmount chassis according to claim 1, wherein the base has a limiting groove configured to be corresponsive to the hook rod, and the hook rod is substantially an L-shaped sheet structure provided for movably passing and installing the hook rod into the limiting groove, and a rear end of the hook rod is fixed to the hook slider.

10. The buckle set for a sliding rail of an industrial rackmount chassis according to claim 1, wherein the positioning block has a positioning column protruded from the center of the positioning block, and the positioning block is substantially in a rectangular shape, and the positioning column is substantially a cylindrical structure, and the hook rod has two inverted hook portions configured to be corresponsive to the positioning block and the positioning column respectively and arranged apart from each other, and each of the inverted hook portions is configured to be corresponsive to the plurality of engaging holes to form a triangular shape.

\* \* \* \* \*